(12) United States Patent
Yoshino et al.

(10) Patent No.: US 7,851,858 B2
(45) Date of Patent: Dec. 14, 2010

(54) MOSFET HAVING SOI AND METHOD

(75) Inventors: Hideo Yoshino, Chiba (JP); Hisashi Hasegawa, Chiba (JP)

(73) Assignee: Seiko Instruments Inc., Chiba-Shi, Chiba (JP)

( * ) Notice: Subject to any disclaimer, the term of this patent is extended or adjusted under 35 U.S.C. 154(b) by 359 days.

(21) Appl. No.: 11/703,258

(22) Filed: Feb. 7, 2007

(65) Prior Publication Data

US 2007/0210382 A1    Sep. 13, 2007

(30) Foreign Application Priority Data

Feb. 7, 2006    (JP) ............... 2006-029853
Jan. 15, 2007   (JP) ............... 2007-006234

(51) Int. Cl.
*H01L 27/12* (2006.01)
*H01L 27/108* (2006.01)
*H01L 29/94* (2006.01)
*H01L 23/58* (2006.01)

(52) U.S. Cl. .............. 257/347; 257/305; 257/509; 257/647; 257/E21.32; 257/E21.55

(58) Field of Classification Search ........... 257/347, 257/509, 647, E21.55, E21.564, E21.563, 257/305, E21.545, E21.561, E21.339, E27.11, 257/E21.32

See application file for complete search history.

(56) References Cited

U.S. PATENT DOCUMENTS

| | | | | |
|---|---|---|---|---|
| 4,282,648 A | * | 8/1981 | Yu et al. | 438/227 |
| 4,466,174 A | * | 8/1984 | Darley et al. | 438/178 |
| 4,700,454 A | * | 10/1987 | Baerg et al. | 438/297 |
| 4,700,461 A | * | 10/1987 | Choi et al. | 438/149 |
| 5,893,729 A | * | 4/1999 | Roisen et al. | 438/163 |
| 6,214,657 B1 | * | 4/2001 | Lee | 438/219 |
| 6,303,441 B1 | * | 10/2001 | Park et al. | 438/270 |
| 6,673,660 B2 | * | 1/2004 | Komatsubara | 438/156 |
| 6,768,174 B2 | * | 7/2004 | Hasegawa et al. | 257/350 |
| 6,987,065 B2 | * | 1/2006 | Sorada et al. | 438/700 |
| 7,235,830 B2 | * | 6/2007 | Sorada et al. | 257/288 |
| 7,473,947 B2 | * | 1/2009 | Murthy et al. | 257/288 |
| 2003/0068870 A1 | * | 4/2003 | Komatsubara | 438/449 |

FOREIGN PATENT DOCUMENTS

| | | |
|---|---|---|
| JP | H08-181316 | 7/1996 |
| JP | 2000-306994 | 11/2000 |
| JP | 2001-148481 | 5/2001 |

* cited by examiner

*Primary Examiner*—Leonardo Andújar
*Assistant Examiner*—Teresa M Arroyo
(74) *Attorney, Agent, or Firm*—Brinks Hofer Gilson & Lione

(57) ABSTRACT

Provided is a semiconductor device formed to an SOI substrate including a MOS transistor in which a parasitic MOS transistor is suppressed. The semiconductor device formed on the SOI substrate by employing a LOCOS process is structured such that a part of a polysilicon layer to becomes a gate electrode includes: a first conductivity type polysilicon region corresponding to a region of the silicon active layer which has a constant thickness and is to become a channel; and second conductivity type polysilicon regions corresponding to LOCOS isolation edges in each of which a thickness of the silicon active layer decreases.

10 Claims, 10 Drawing Sheets

MOSFET HAVING SOI AND METHOD

This application claims priority under 35 U.S.C. §119 to Japanese Patent Application Nos. JP2006-029853 filed Feb. 7, 2006, and JP2007-006234 filed Jan. 15, 2007, the entire content of which is hereby incorporated by reference.

BACKGROUND OF THE INVENTION

1. Field of the Invention

The present invention relates to a MOS field-effect transistor having silicon on insulator (SOI) structure.

2. Description of the Related Art

In recent years, with the explosive expansion of the Internet and advancement of a multimedia information society, a mobile information terminal market has been growing remarkably. There is a demand for further miniaturization and reduction in power consumption of information devices or LSIs constituting the information devices. As a device technique for meeting the demand, an SOI device has been focused. When a MOS transistor is formed on a semiconductor substrate having an SOI structure, as compared with a conventional bulk Si device, it is advantageous in terms of reduction in a parasitic capacitance such as a junction capacitance and a wiring capacitance, a low substrate bias effect, suppress of a short channel effect, perfect device isolation, a steep subthreshold characteristic, and the like. As a result, a large effect of low power consumption and high performance of the LSI can be exerted.

However, there is a technical problem in the SOI type MOS transistor. When a local oxidation of silicon (LOCOS) process is applied to element isolation, a thin silicon active layer is formed at a LOCOS isolation edge, thereby leading to formation of a parasitic MOS transistor having a low threshold voltage, and such a characteristic as to exhibit a hump shape (hereinafter, referred to simply as "hump") may be caused in an Id-Vg characteristic. The hump is likely to generate in an NMOS and leads to a leak current.

As means for preventing the generation of the hump, for example, JP 08-181316 A proposes a method of forming a high concentration impurity on a substrate provided immediately below the LOCOS isolation edge or on the entire surface of the substrate, and JP 2000-306994 A proposes a method of changing a shape of the LOCOS isolation edge. Further, as another means for preventing the generation of the hump, JP 2001-148481 A discloses a method of lowering a temperature to 800° C. in an atmosphere of oxygen after LOCOS oxidation and then taking out a wafer from an oxidation furnace, thereby suppressing the generation of the hump with a greater use of fixed charges.

However, in these methods there is a problem that processes such as ion implantation and annealing are additionally employed in the method of JP 08-181316 A, processes are complicated in the method of JP 2000-306994 A, and that only a small effect can be obtained in NMOS or CMOS in the method of JP 2001-148481 A.

SUMMARY OF THE INVENTION

The present invention has been made to solve the above-mentioned problems, and an object of the present invention is to provide an SOI type MOS transistor capable of suppressing a parasitic MOS transistor which causes a trouble, and driving the MOS transistor with a low consumption current while using an element isolation technique by a conventional LOCOS process.

In order to solve the above-mentioned problems, the present invention provides the following means.

(1) There is provided a semiconductor device having a structure including: an SOI semiconductor substrate including a semiconductor supporting substrate, a buried insulating film formed on the semiconductor supporting substrate, and a silicon active layer formed on the buried insulating film; a first conductivity type MOS transistor which is formed to the silicon active layer and has a gate electrode; and an element isolation insulating film having a thickness to reach the buried insulating film in a depth direction by a LOCOS process and surrounding the MOS transistor, in which the gate electrode of the MOS transistor includes: a first conductivity type polysilicon region corresponding to a region of the silicon active layer which is to become a channel; and second conductivity type polysilicon regions corresponding to LOCOS isolation edges.

(2) In the semiconductor device, the gate electrode of the MOS transistor has a laminated structure in which a polysilicon layer having a first conductive region and a second conductive region is laminated with a refractory metal silicide layer.

(3) In the semiconductor device, the MOS transistor has an impurity diffusion layer which is changed between the first conductivity type and the second conductivity in a source region.

(4) There is provided a method of manufacturing a semiconductor device including a MOS transistor formed on a silicon active layer of an SOI substrate including the steps of: forming an element isolation insulating film with a thickness to reach a buried insulating film by thermal oxidation to form the MOS transistor above the silicon active layer; forming a gate insulating film having a thickness of about 5 to 30 nm by thermal oxidation; a step of forming a polysilicon layer having a thickness of 200 to 400 nm on the gate insulating film; imparting a first conductivity type selectively to a part of the polysilicon layer by doping a first conductive impurity by ion implantation with an impurity concentration of $1 \times 10^{18}$ atoms/cm$^3$ or more after application of a photo resist onto the polysilicon layer and patterning; imparting a second conductivity type selectively to a part of the polysilicon layer by doping a second conductive impurity by ion implantation with an impurity concentration of $1 \times 10^{18}$ atoms/cm$^3$ or more after application of a photo resist onto the polysilicon layer and patterning; etching the polysilicon layer to form a gate electrode; doping an impurity partially and selectively in the silicon active layer through patterning regions of the MOS transistor to become a source and a drain with a photo resist; forming an intermediate insulating layer on the SOI substrate; forming a contact hole in the intermediate insulating layer formed on the SOI substrate; forming a metal wiring in the contact hole; and forming a protective film.

(5) The method of manufacturing a semiconductor device further includes the steps of: forming, after the deposition of the polysilicon, an oxide film with a thickness of about 300 to 400 nm to form a hard mask by heat treatment; patterning with a photo resist to etch the oxide film; imparting one of a first conductivity type and a second conductivity type selectively to a part of the polysilicon layer by performing pre-deposition of corresponding one of a first conductivity type impurity and a second conductivity type impurity with an impurity concentration of $1 \times 10^{18}$ atoms/cm$^3$ or more; and imparting a reverse conductivity type selectively to a part of the polysilicon layer by removing the oxide film and doping a reverse conductive impurity by ion plantation on an entire region with an impurity concentration of $1 \times 10^{18}$ atoms/cm$^3$ or more.

(6) The method of manufacturing a semiconductor device includes the steps of: forming, after the deposition of the polysilicon, an oxide film with a film thickness of about 300 to 400 nm to form a hard mask by heat treatment; patterning with a photo resist to etch the oxide film; imparting one of a first conductivity type and a second conductivity type selectively to a part of the polysilicon layer by performing pre-deposition of corresponding one of a first conductivity type impurity and a second conductivity type impurity with an impurity concentration of $1\times10^{18}$ atoms/cm$^3$ or more; further forming an oxide film with a film thickness of about 300 to 400 nm to form a hard mask by heat treatment; patterning with a photo resist to etch the oxide film; and imparting a reverse conductivity type selectively to a part of the polysilicon layer by pre-deposition of a reverse conductive impurity.

(7) The method of manufacturing a semiconductor device further includes the steps of: forming, after the step of imparting the first and second conductivity types to the polysilicon layer, an element isolation insulating film with a thickness to reach a buried insulating film by thermal oxidation to form the MOS transistor above the silicon active layer; and forming a gate insulating film having a thickness of about 5 to 30 nm by thermal oxidation;

(8) The method of manufacturing a semiconductor device further includes the steps of: patterning, after the step of forming the gate electrode, regions of the MOS transistor to become a source and a drain with a photo resist and partially and selectively doping a first conductive impurity in the silicon active layer; and partially and selectively doping a second conductive impurity in the source region through patterning with a photo resist.

In the SOI semiconductor device, the conductivity type of the gate electrode is divided into two such that a polysilicon gate electrode of the MOS transistor has a high threshold voltage at the LOCOS isolation edge, and has a low threshold voltage in a channel region of the center of the gate. As a result, it is possible to provide a MOS transistor capable of suppressing generation of a parasitic MOS transistor which generates at the LOCOS isolation edge, and driving with a low consumption current.

DETAILED DESCRIPTION OF THE PREFERRED EMBODIMENTS

Hereinafter, an embodiment of an n-type MOS transistor according to the present invention will be described in detail with reference to the attached drawings.

As a first embodiment, FIGS. 1 to 4 are plan views and sectional views each showing a main part of a semiconductor device according to an embodiment of the present invention.

Figure 1:
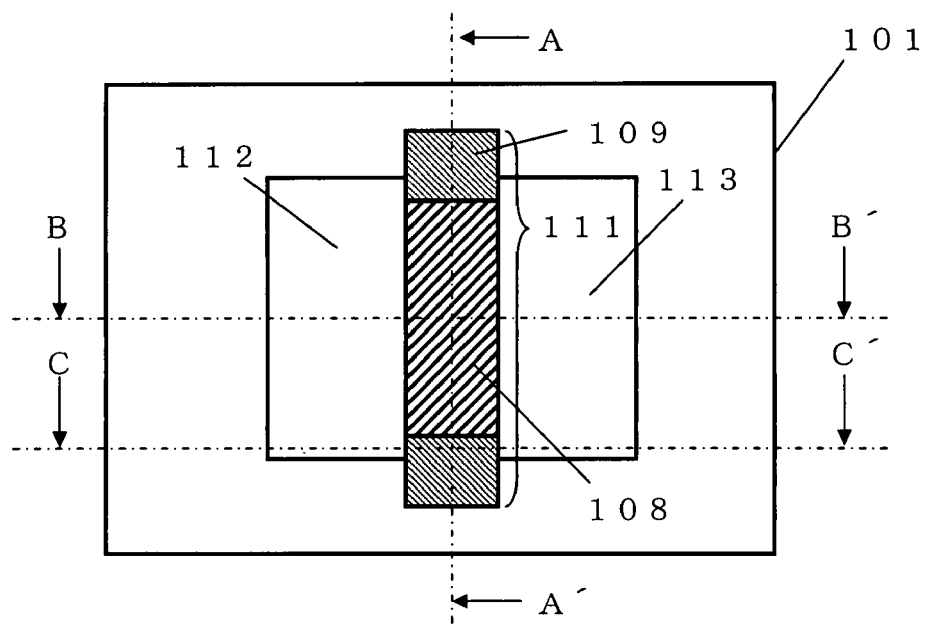
FIG. 1 is a plan view showing a main part of a semiconductor device according to a first embodiment of the present invention.
Figure 2:
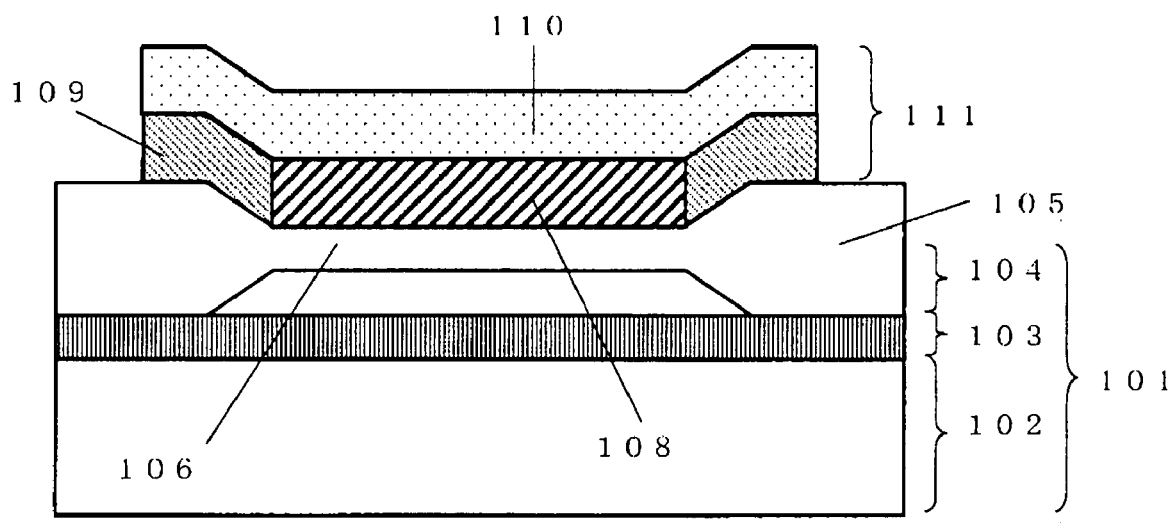
FIG. 2 is a sectional view of the semiconductor device taken along the line A-A' of FIG. 1 according to the first embodiment of the present invention.
Figure 3:
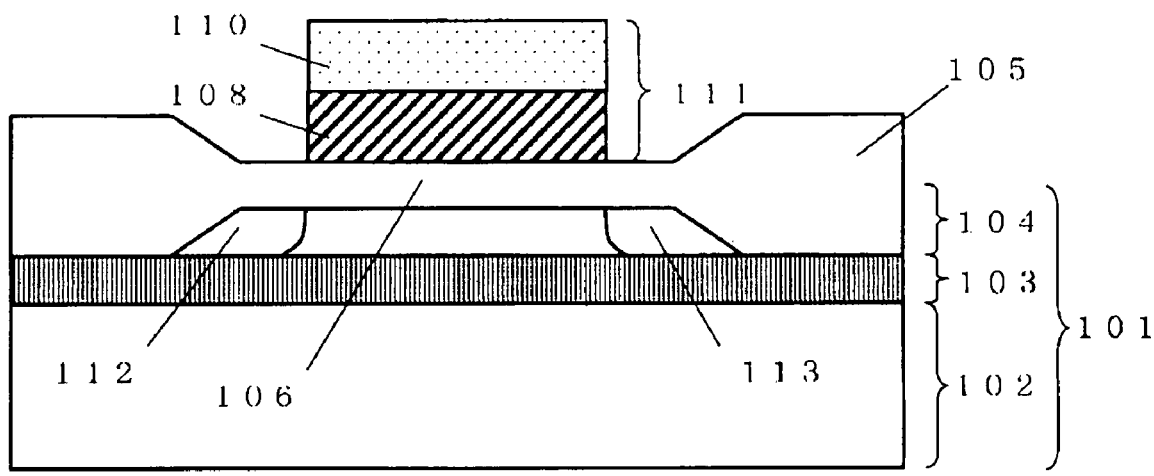
FIG. 3 is a sectional view of the semiconductor device taken along the line B-B' of FIG. 1 according to the first embodiment of the present invention.
Figure 4:
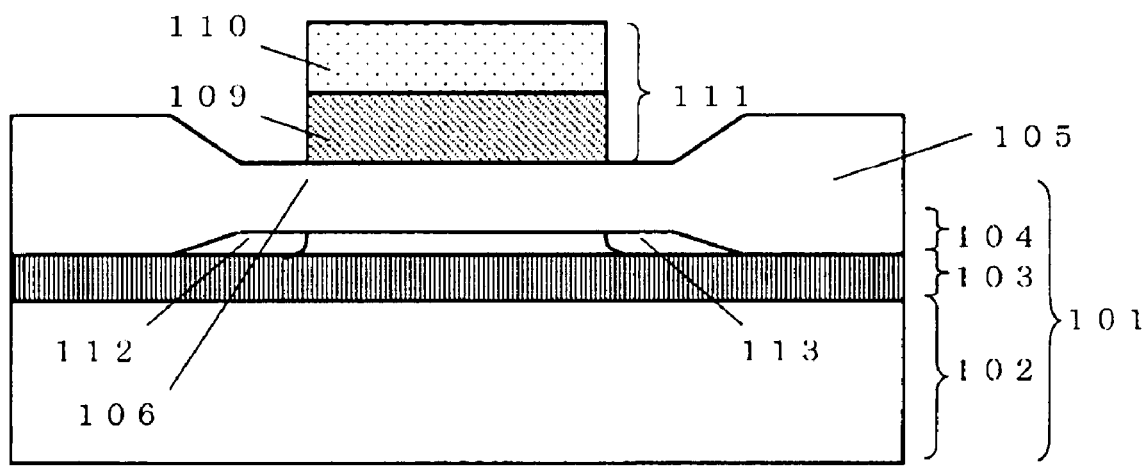
FIG. 4 is a sectional view of the semiconductor device taken along the line C-C' of FIG. 1 according to the first embodiment of the present invention.

FIG. 2 is a sectional view of the semiconductor device taken along the line A-A' of FIG. 1. FIG. 3 is a sectional view of the semiconductor device taken along the line B-B' of FIG. 1. FIG. 4 is a sectional view of the semiconductor device taken along the line C-C' of FIG. 1. In FIGS. 1 to 4, a semiconductor substrate 101 is a p-type bonded silicon on insulator (SOI) substrate which has, for example, a three-layered structure of a p-type single crystal semiconductor substrate 102, a buried insulating film 103 having a film thickness of about 50 to 400 nm, and a p-type silicon active layer 104 having a thickness of about 50 to 200 nm. The buried insulating film 103 insulates the single crystal semiconductor supporting substrate 102 and the p-type silicon active layer 104 from each other. Each concentration of the p-type single crystal semiconductor supporting substrate 102 and the p-type silicon active layer 104 is generally in about a range from $1\times10^{14}$ cm$^{-3}$ to $1\times10^{15}$ cm$^{-3}$. In this case, the p-type bonded substrate is used as the SOI substrate 101. Alternatively, it is possible to use a p-type SIMOX (Separation by IMplanted OXygen) substrate having an SOI structure formed through implantation of an oxygen into a p-type bulk Si substrate and high-temperature annealing.

An n-type MOS transistor is formed on the silicon active layer 104 formed on the buried insulating layer 103. The MOS transistor is electrically insulated from the periphery by a field insulating film 105 which is formed by a local oxidation of silicon (LOCOS) process with a thickness of about 100 to 500 nm and is in contact with the buried insulating film 103. In this case, by employment of the LOCOS process, the silicon active layer 104 is formed into a thin film at a LOCOS isolation edge, as shown in FIG. 4. Through the gate insulating film 106 having a film thickness about 5 to 30 nm, there is formed a gate electrode 111 which is composed of an n-type impurity region 108 and p-type impurity regions 109 which are formed of polysilicon having a thickness of about 200 to 300 nm, and a refractory metal silicide 110 deposited on the polysilicon. As shown in FIG. 1, the n-type impurity region 108 and the p-type impurity regions 109 of the gate electrode are formed through ion implantation in the polysilicon by changing an ion species so that a channel region becomes an n-type region and the LOCOS isolation edge becomes a p-type region. Due to the refractory metal silicide 110 which is deposited on the polysilicon having the n-type and p-type regions and has a thickness about 100 nm, a sheet resistance of the gate electrode 111 is reduced. On each side of the gate electrode 111 a source region 112 and a drain region 113 are configured respectively.

Use of N-type conductive polysilicon in the channel region and p-type conductive polysilicon at the LOCOS isolation edge enables to lower the threshold voltage in the channel region of the NMOS, and to increase the threshold voltage at the LOCOS isolation edge due to a difference between work functions of each of a p-type gate and a p-type silicon active layer. As a result, it is possible to suppress generation of the parasitic MOS transistor at the LOCOS isolation edge while driving the transistor at a low drive voltage in the channel region of the NMOS transistor.

Next, en embodiment of a method of manufacturing the semiconductor device shown in FIGS. 1 to 4 will be described with reference to FIGS. 5A, 5B, 6A, 6B, 7A, 7B, 8A, 8B, 9A, 9B, 10A, 10B, 11A, and 11B.

Figure 5A:
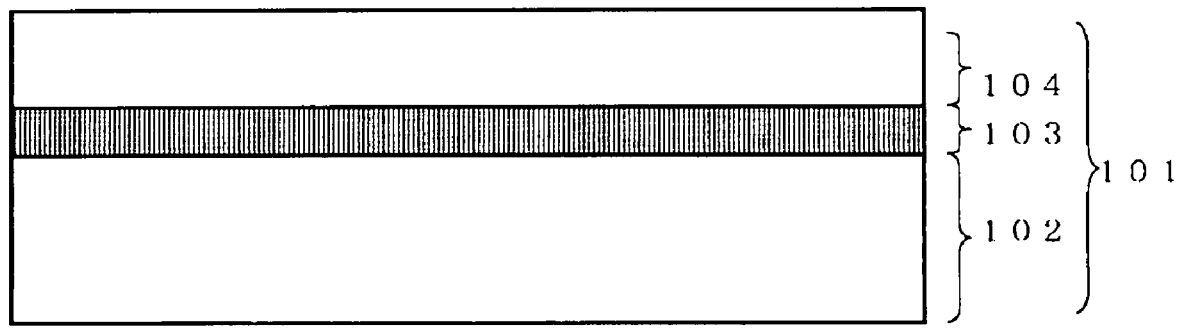
FIGS. 5A and 5B are sectional views each showing the semiconductor device taken along the line A-A' of FIG. 1 and further showing a manufacturing process thereof according to the first embodiment of the present invention.
Figure 5B:
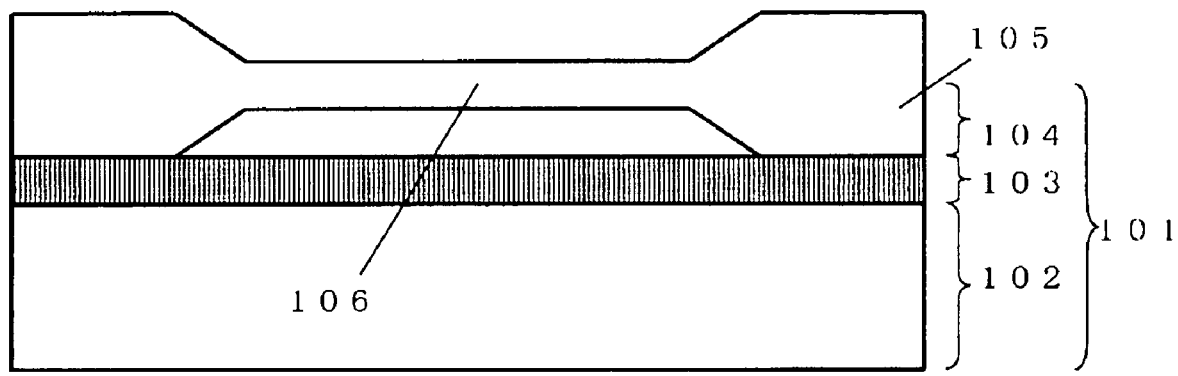
Figure 6A:
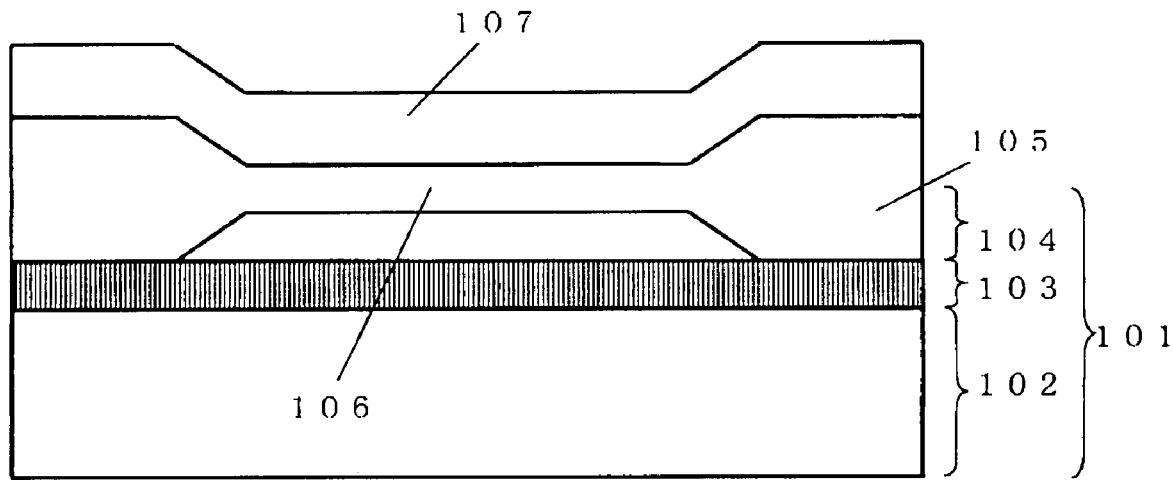
FIGS. 6A and 6B are sectional views each showing the semiconductor device taken along the line A-A' of FIG. 1 and further showing the manufacturing process thereof according to the first embodiment of the present invention.

For example, on the SOI substrate 101 having the three-layered structure of the p-type single crystal semiconductor supporting substrate 102, the buried insulating film 103 having the film thickness of about 50 to 400 nm, and the p-type silicon active layer 104 having the thickness about 50 to 200 nm as shown in FIG. 5A, the field insulating film 105 having the film thickness of about 100 to 500 nm as shown in FIG. 5B is formed by the LOCOS process. Then, on the surface of the semiconductor substrate 101, a silicon oxide film having a film thickness of about 5 to 30 nm is formed as the gate insulating film 106 by thermal oxidation. After that, as shown in FIG. 6A, the polysilicon layer 107 which serves as the gate electrode of the MOS transistor is deposited with a thickness of about 200 to 400 nm.

Figure 6B:
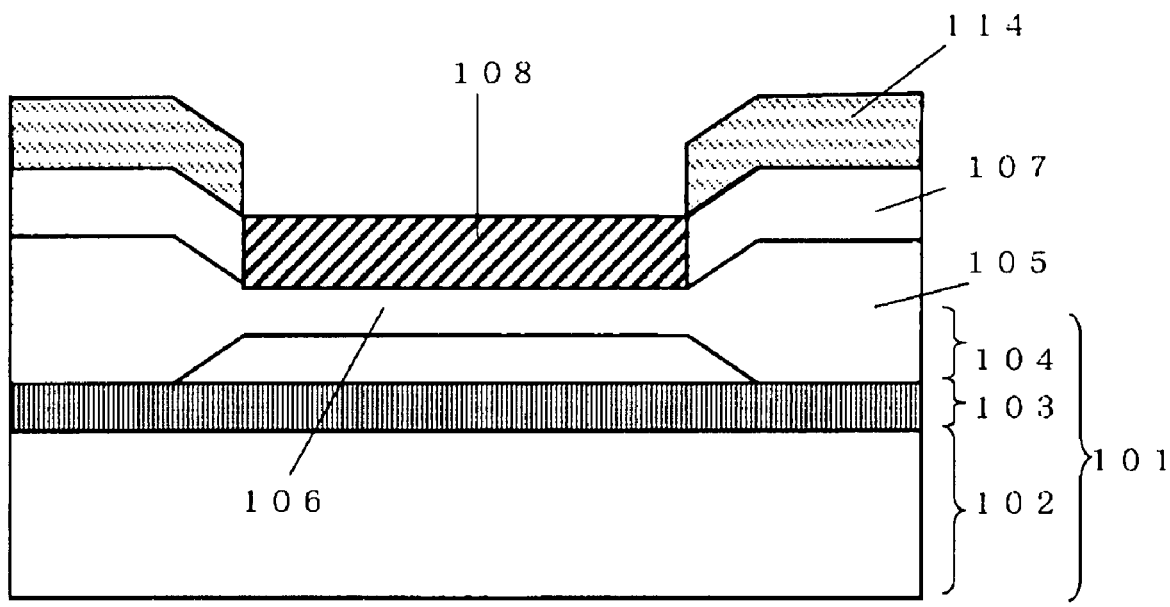
Figure 7A:
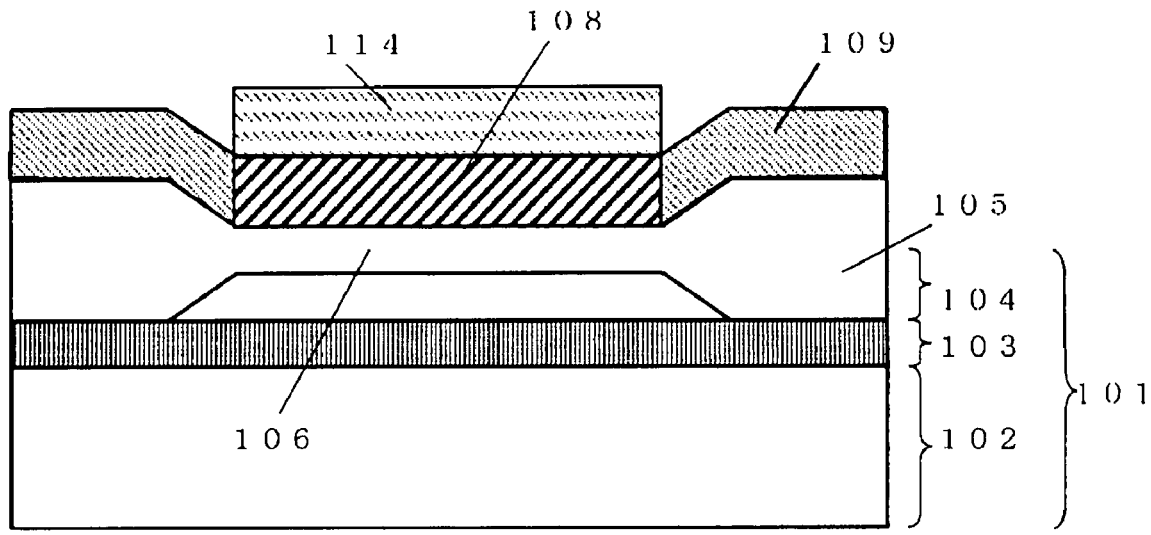
FIGS. 7A and 7B are sectional views each showing the semiconductor device taken along the line A-A' of FIG. 1 and further showing the manufacturing process thereof according to the first embodiment of the present invention.
Figure 7B:
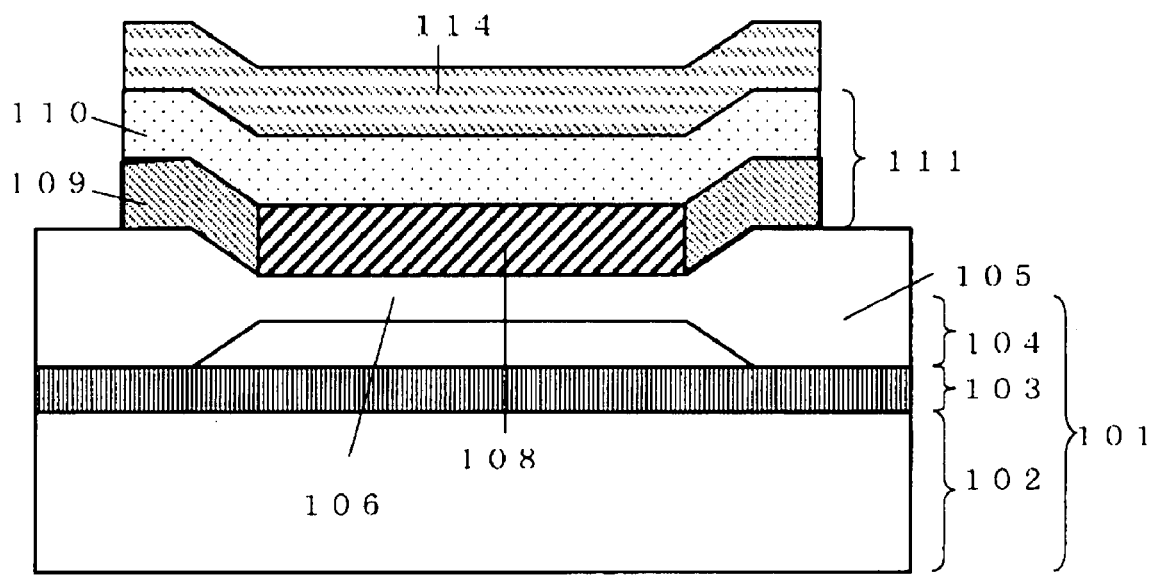
Figure 8A:
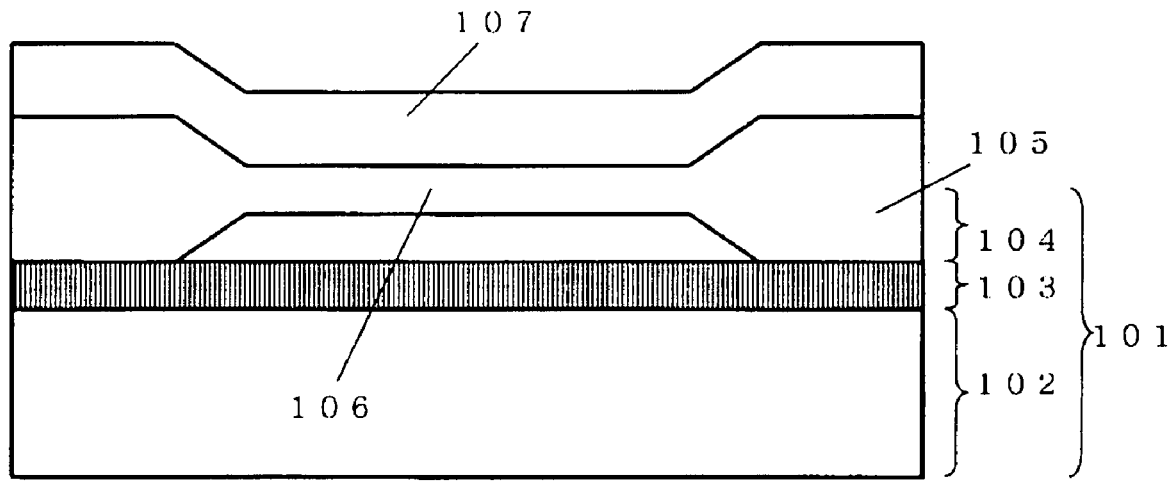
FIGS. 8A and 8B are sectional views each showing a semiconductor device taken along the line B-B' of FIG. 1 and further showing a manufacturing process thereof according to the first embodiment of the present invention.
Figure 8B:
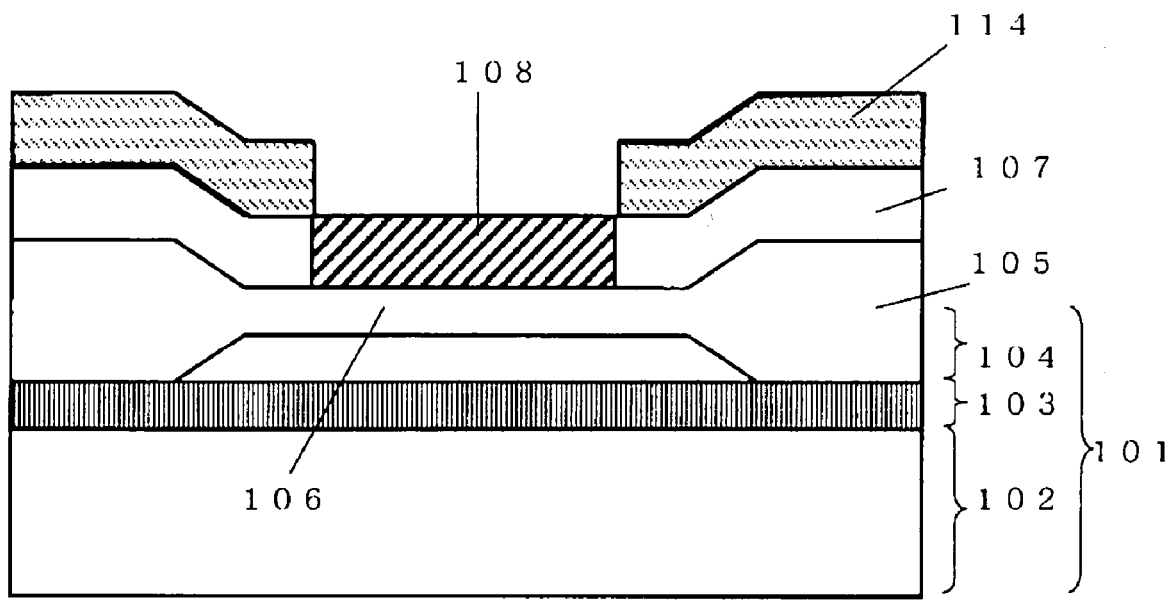
Figure 9A:
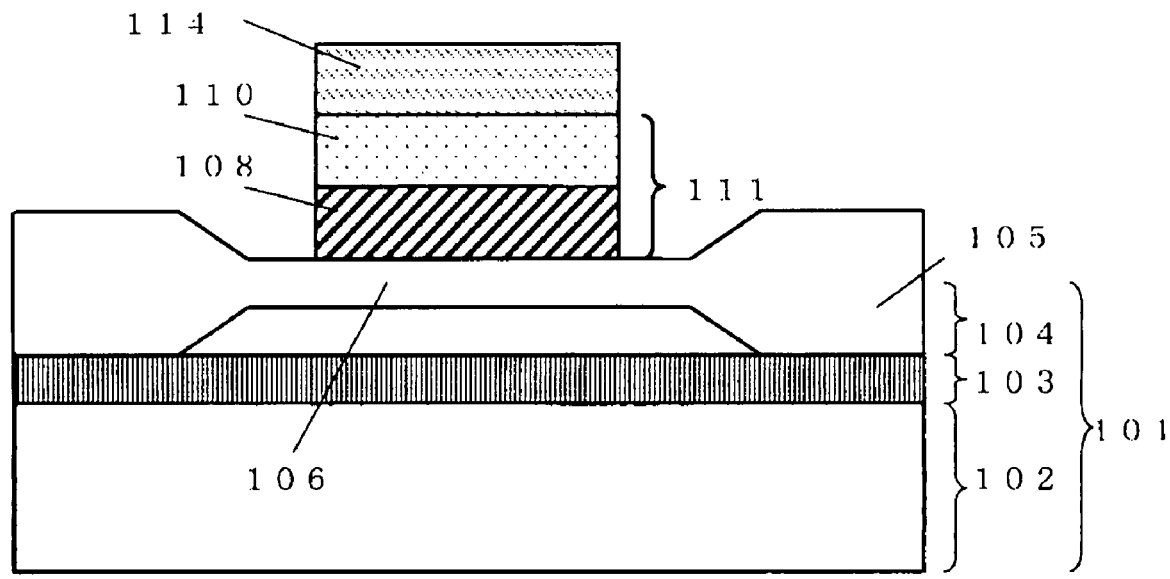
FIGS. 9A and 9B are sectional views each showing the semiconductor device taken along the line B-B' of FIG. 1 and further showing the manufacturing process thereof according to the first embodiment of the present invention.
Figure 9B:
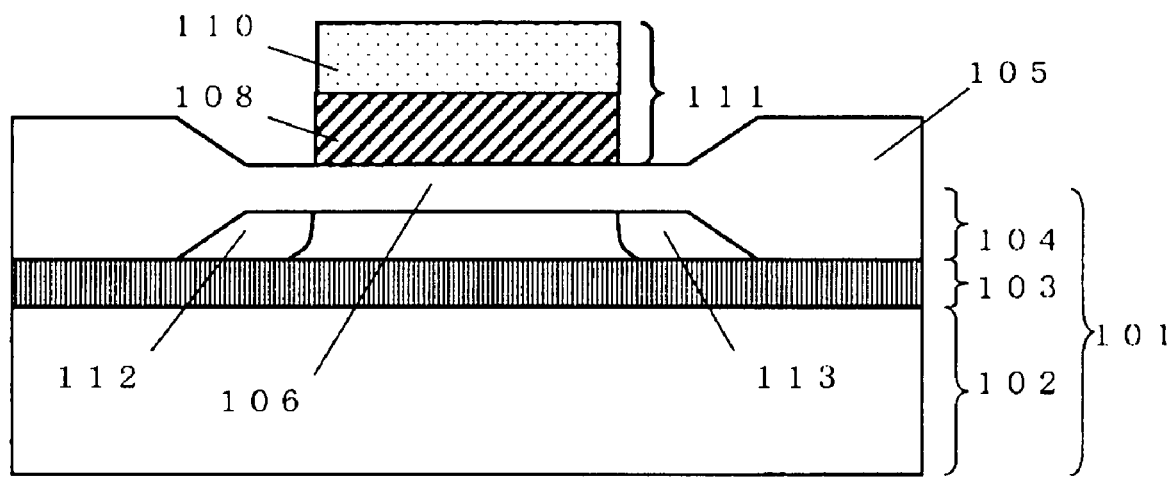
Figure 10A:
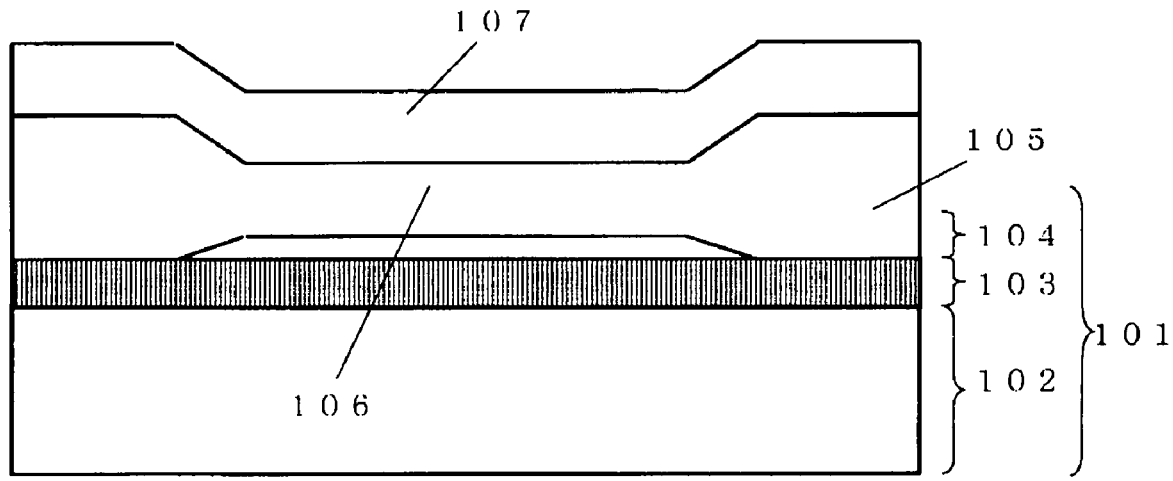
FIGS. 10A and 10B are sectional views each showing a semiconductor device taken along the line C-C' of FIG. 1 and further showing a manufacturing process thereof according to the first embodiment of the present invention.
Figure 10B:
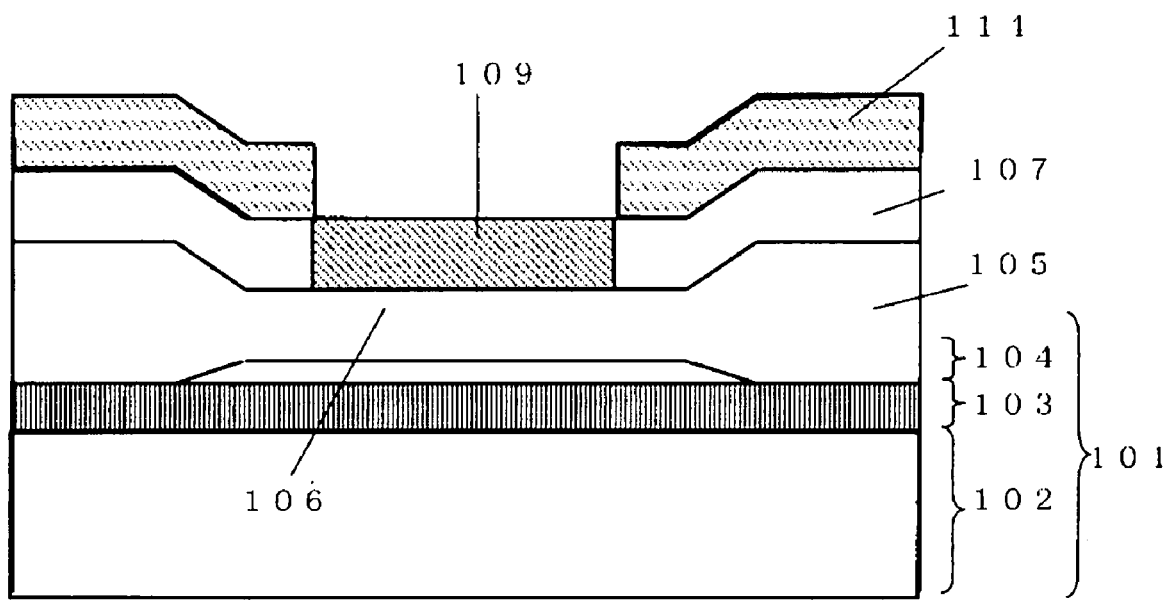
Figure 11A:
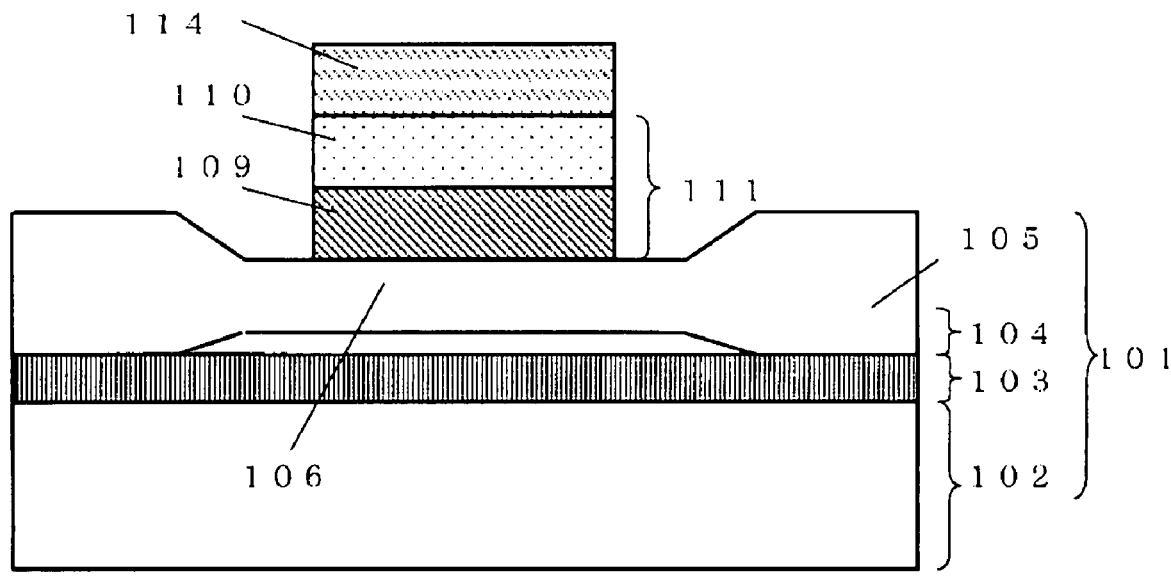
FIGS. 11A and 11B are sectional views each showing the semiconductor device taken along the line C-C' of FIG. 1 and further showing the manufacturing process thereof according to the first embodiment of the present invention.
Figure 11B:
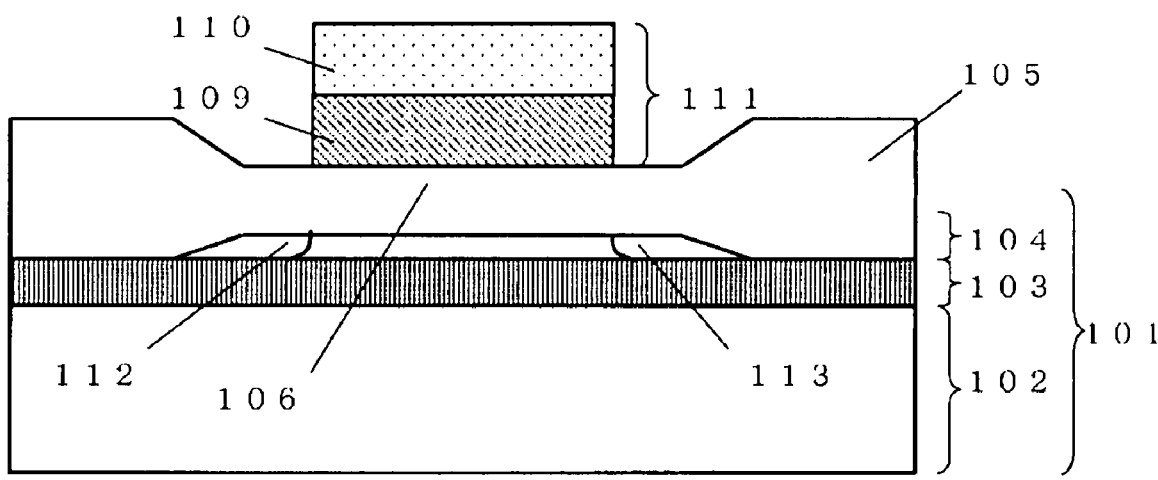

As shown in FIG. 6B, the surface of the polysilicon layer 107 is subjected to patterning with a photo resist 114, and is partially implanted with an n-type impurity such as arsenic by ion implantation. The portion becomes thereafter the n-type region 108 for the channel region of the gate electrode 111. A dosage thereof is 5×1015 cm−2. After that, as shown in FIG. 7A, the patterning is performed with the photo resist 114, and the ion implantation is partially performed with the p-type impurity such as BF2. The portion becomes thereafter the p-type region 109 for the LOCOS isolation edge of the gate electrode 111. The ion implantation is performed with a dosage thereof is about $8 \times 10^{15}$ cm$^{-2}$. After that, the semiconductor substrate 101 is subjected to thermal treatment at a temperature of about 850° C. to diffuse the impurity provided in the gate electrode 111. Then, as shown in FIG. 7B, in order to reduce the sheet resistance, the refractory metal silicide 110 is deposited with a thickness of about 100 nm, and is subjected to patterning of the photo resist and etching, to thereby form the gate electrode 111 having the n-type region 108 and the p-type regions 109. In this case, the ion implantation method is employed to form the n-type region 108 and the p-type regions 109, but phosphorus pre-deposition may be employed to form the n-type region and boron pre-deposition may be employed to form the p-type region. When the pre-deposition is employed, the pre-deposition is performed after patterning is performed with an oxide film as a hard mask to form the gate electrode. Alternatively, the pre-deposition may be employed to form the n-type region, and the ion implantation may be employed to form the p-type region. Further alternatively, the pre-deposition may be employed to form the p-type region, and the ion implantation may be employed to form the n-type region. In this case, the pre-deposition is performed first, the hard mask is removed, and then the ion implantation is performed on the entire surface, thereby making it possible to suppress, for example, penetration of the boron.

FIGS. 8A, 8B, 9A, and 9B are sectional views each showing the semiconductor device taken along the line B-B' of FIG. 1, and FIGS. 10A, 10B, 11A, and 11 B are sectional views each showing the semiconductor device taken along the line C-C' of FIG. 1. Those figures further show processes following the process shown in FIGS. 7A and 7B. As shown in FIGS. 8A, 8B, 9A, 9B, 10A, 10B, 11A, and 11 B, ion implantation is performed with a high concentration n-type impurity such as an arsenic with the formed gate electrode 111 and the field insulating film 105 being used as masks, to thereby form the source region 112 and the drain region 113. Each concentration of the source and drain regions is generally about $5 \times 10^{19}$ cm$^{-3}$ to $1 \times 10^{21}$ cm$^{-3}$. After that, an inter-layer insulation film (not shown) is deposited thereon so as to electrically connect the source region 112 and the drain region 113, and the gate electrode 111 to one another.

Figures 12A, 12B:
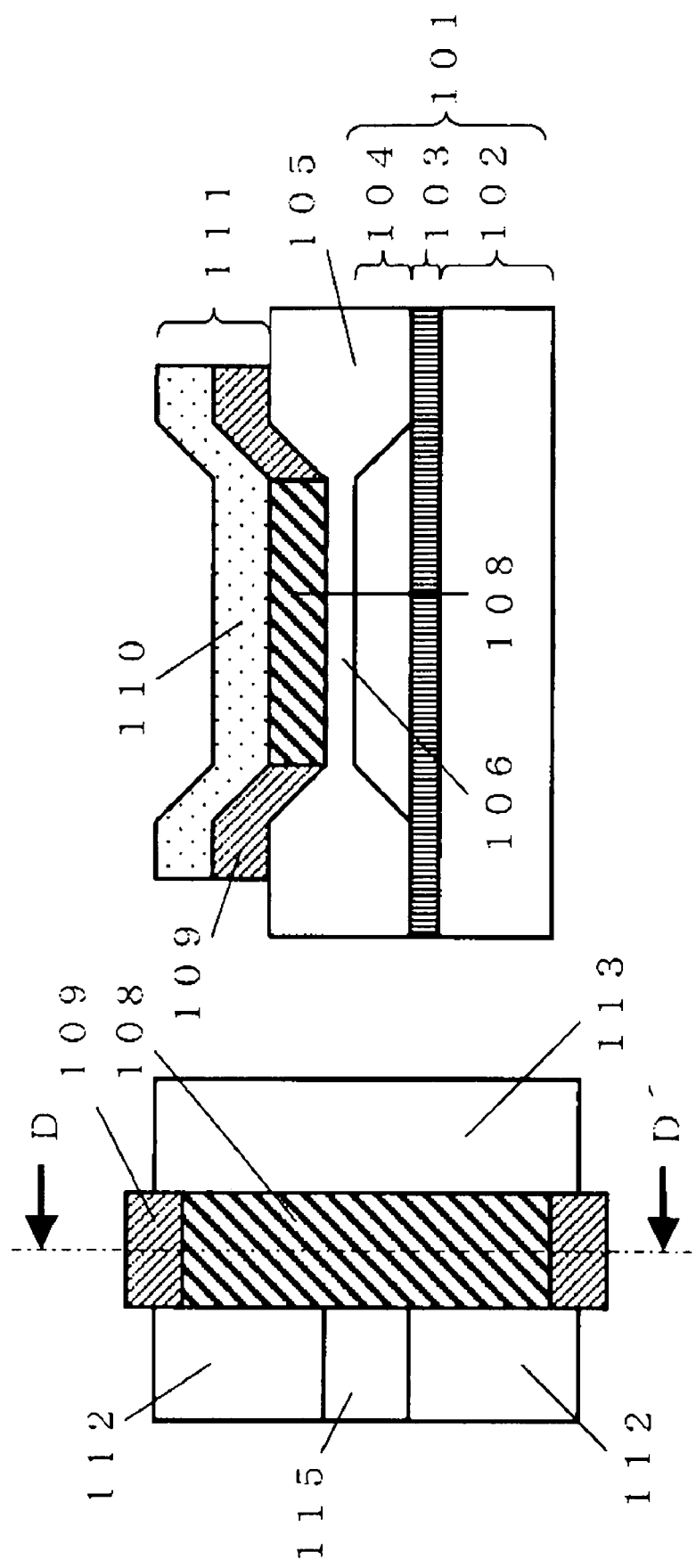
FIG. 12A is a plan view of an n-type MOS transistor having a body contact region formed therein according to another embodiment of the present invention.
FIG. 12B is a sectional view of the n-type MOS transistor taken along the line D-D' of FIG. 12A.

FIG. 12 shows a second embodiment of the present invention. FIG. 12A is a plan view of an n-type MOS transistor using the SOI substrate 101, and FIG. 12B is a sectional view of the n-type MOS transistor taken along the line D-D' of FIG. 12A. As shown in FIG. 12A, the NMOS transistor has a structure in which a p+ body contact region 115 is formed in the source region 112.

In this case, the polysilicon gate electrode 111 has a structure in which the channel region becomes n-type and the LOCOS isolation edge regions become p-type in the same manner as in the first embodiment by impurity doping. As a result, it is possible to suppress generation of the parasitic MOS transistor at the LOCOS isolation edge. In addition, formation of the p+body contact region 115 thereby enables to fix a potential of the substrate and suppress a substrate floating effect.

Note that the n-type MOS transistor is described in this embodiment, but a p-type MOS transistor may be employed to obtain the similar structure.

What is claimed is:

1. A semiconductor device comprising:
   an SOI semiconductor substrate including a semiconductor supporting substrate, a buried insulating film formed on the semiconductor supporting substrate, and a silicon active layer formed on the buried insulating film; and
   a MOS transistor of a first conductivity disposed on the silicon active layer, the MOS transistor comprising a gate electrode on a gate insulating film; and
   an element isolation insulating film surrounding the MOS transistor;
   the gate electrode of the MOS transistor comprising a first polysilicon region of a first conductivity disposed above a channel region of the silicon active layer having a constant thickness; and second polysilicon regions of a second conductivity disposed above edge regions of the silicon active layer at which a thickness of the silicon active layer decreases along a width direction of the MOS transistor; and
   wherein the element isolation insulating film is disposed between the second polysilicon regions and the edge regions of the silicon active layer.

2. The semiconductor device according to claim 1, wherein the gate electrode of the MOS transistor has a laminated structure in which a polysilicon layer having a first conductive region and second conductive regions is laminated with a refractory metal silicide layer.

3. The semiconductor device according to claim 1, wherein the MOS transistor has an impurity diffusion layer of a second conductivity in a source region of a first conductivity.

4. A semiconductor device comprising:
an SOI semiconductor substrate including a semiconductor supporting substrate, a buried insulating film formed on the semiconductor supporting substrate, and a silicon active layer formed on the buried insulating film; and
a first conductivity type MOS transistor which is formed to the silicon active layer and has a gate electrode, wherein
the MOS transistor is surrounded by an element isolation insulating film having a thickness to reach the buried insulating film in a depth direction by a LOCOS process;
the gate electrode of the MOS transistor comprises:
a n-type polysilicon region above a first region of the silicon active layer that comprises a constant thickness; and
first and second p-type polysilicon regions corresponding to LOCOS isolation edges above second regions of the silicon active layer that comprises a thickness that is less that the thickness of the first region of the active silicon layer that is below the n-type polysilicon region; and
the element isolation insulating film is disposed between the first and second p-type polysilicon regions and the second regions of the silicon active layer.

5. The semiconductor device according to claim 4, wherein the gate electrode of the MOS transistor has a laminated structure in which a polysilicon layer having a first conductive region and a second conductive region is laminated with a refractory metal silicide layer.

6. The semiconductor device according to claim 4, wherein the MOS transistor comprises a second conductive impurity diffusion layer in a first conductive source region.

7. The semiconductor device according to claim 4, wherein the element isolation insulating film comprising a gate insulating film between the n-type polysilicon layer and the silicon active region.

8. The semiconductor device according to claim 7, wherein the gate insulating film comprises a thickness of between approximately 5 nm and approximately 30 nm.

9. The semiconductor device according to claim 1, wherein the element isolation insulating film comprises a thickness to reach the buried insulating film in a depth direction.

10. The semiconductor device according to claim 1, wherein the gate insulating film is disposed below the first polysilicon region and above the silicon active layer.

* * * * *

UNITED STATES PATENT AND TRADEMARK OFFICE
CERTIFICATE OF CORRECTION

PATENT NO. : 7,851,858 B2
APPLICATION NO. : 11/703258
DATED : December 14, 2010
INVENTOR(S) : Hideo Yoshino et al.

Page 1 of 1

It is certified that error appears in the above-identified patent and that said Letters Patent is hereby corrected as shown below:

In the Claims

In column 7, claim 4, line 26, before "the thickness of the first region" replace "that" with --than--.

Signed and Sealed this
Nineteenth Day of April, 2011

David J. Kappos
*Director of the United States Patent and Trademark Office*